United States Patent [19]

Takemae

[11] Patent Number: 5,404,328
[45] Date of Patent: Apr. 4, 1995

[54] MEMORY CELL HAVING FLOATING GATE AND SEMICONDUCTOR MEMORY USING THE SAME

[75] Inventor: Yoshihiro Takemae, Tokyo, Japan

[73] Assignee: Fujitsu Limited, Kawasaki, Japan

[21] Appl. No.: 262,352

[22] Filed: Jun. 20, 1994

Related U.S. Application Data

[63] Continuation of Ser. No. 623,343, Dec. 6, 1990, abandoned.

[30] Foreign Application Priority Data

Dec. 7, 1989 [JP] Japan .................. 1-318378

[51] Int. Cl.[6] .......................................... G11C 11/34
[52] U.S. Cl. ..................................... 365/185; 365/181
[58] Field of Search ........... 365/181, 174, 185, 189.08, 365/149; 257/386; 307/469

[56] References Cited

U.S. PATENT DOCUMENTS

| | | | |
|---|---|---|---|
| 4,132,904 | 1/1979 | Harari | 307/238 |
| 4,228,527 | 10/1980 | Greber | 365/181 |
| 4,710,900 | 12/1987 | Higuchi | 365/185 |
| 4,845,680 | 7/1989 | Iwahashi | 365/185 |
| 4,873,670 | 10/1989 | Tanaka | 365/185 |
| 4,885,719 | 12/1989 | Brahmbhatt | 365/185 |
| 5,016,217 | 5/1991 | Brahmbhatt | 365/181 |
| 5,059,835 | 10/1991 | Lauffer | 307/469 |

FOREIGN PATENT DOCUMENTS

| | | |
|---|---|---|
| 0103043 | 3/1984 | European Pat. Off. . |
| 0254139 | 1/1988 | European Pat. Off. . |
| 89/06068 | 6/1989 | WIPO . |

OTHER PUBLICATIONS

Krick, "Complemetary MNOS Electronically Alterable Read-Only Memory," IBM Technical Disclosure Bulletin, vol. 13, No. 1, Jun. 1970, New York, N.Y., pp. 263–264.

Medwin et al., "FACMOS EAROM," RCA Technical Notes, No. 1185, Jun. 24, 1977, Princeton, N.J., pp. 1–4.

Saleh et al., "A Simulation of a Non-Avalanche Injection Based CMOS EEPROM Memory Cell Compatible with Scaling-Down Trends,", IEEE 1985 Electronicom, vol. 3, Oct. 6, 1985, Toronto, Ontario, CA, pp. 590–593.

Weste et al., "Principles of CMOS VLSI Design," Addison Wesley, Reading, Pa., Oct. 1985, pp. 43–49.

Wright, "High-speed EPROMS," EDN Electrical Design News, vol. 32, No. 19, Sep. 17, 1987, Newton, Mass., pp. 132–138.

Ohtsuka et al., "A 4-Mbit CMOS EPROM," IEEE Journal of Solid-State Circuits, vol. 22, No. 5, Oct. 1987, New York, N.Y., pp. 669–675.

Schultz et al., "A Microprogrammable processor using single poly EPROM," Integration, The VLSI Journal, vol. 8, No. 2, Nov. 1989, Amsterdam, NL, pp. 189–199.

Primary Examiner—Eugene R. LaRoche
Assistant Examiner—A. Zarabian
Attorney, Agent, or Firm—Staas & Halsey

[57] ABSTRACT

A memory cell for storing data includes a first field effect transistor having a source receiving a first voltage, a floating gate, and a drain receiving data to be written into the memory cell and outputting the data, and a second field effect transistor having a source receiving a second voltage, a floating gate connected to the floating gate of the first field effect transistor, and a drain connected to the drain of the first field effect transistor. The second field effect transistor has a conduction type opposite to that of the first field effect transistor. The memory cell has a capacitor which has a first terminal receiving a select signal for identifying the memory cell, and a second terminal connected to the floating gates of the first and second field effect transistors. The data is stored in the floating gates of the first and second field effect transistors.

11 Claims, 11 Drawing Sheets

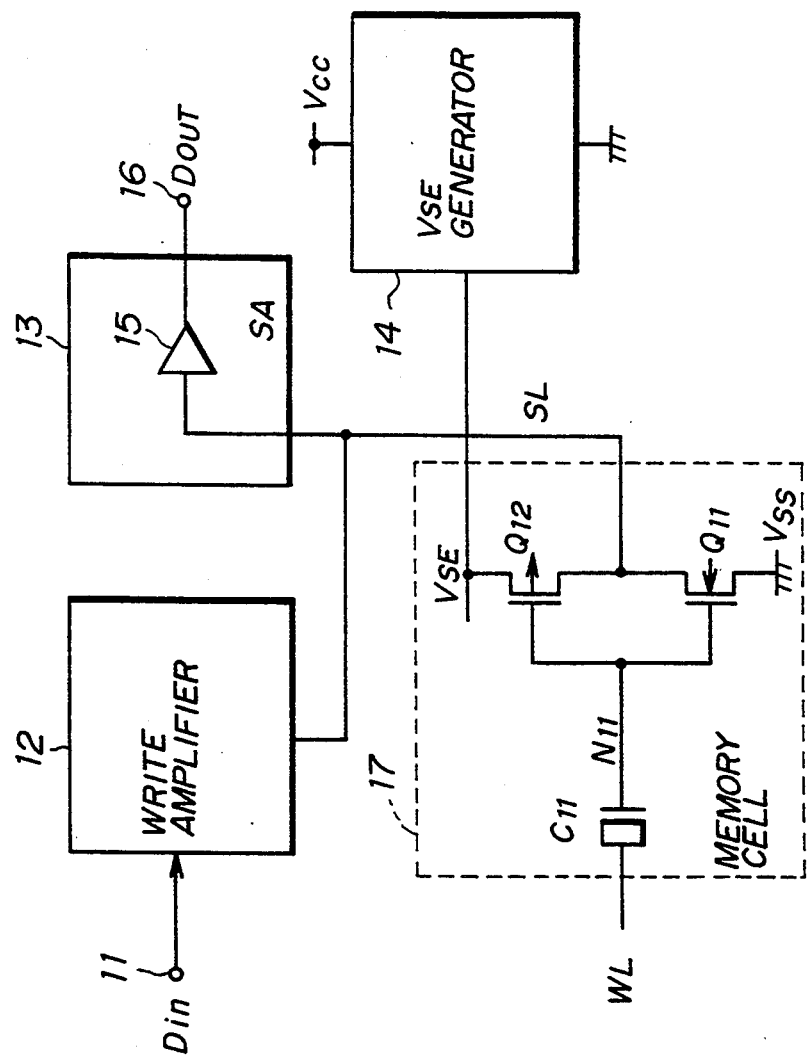

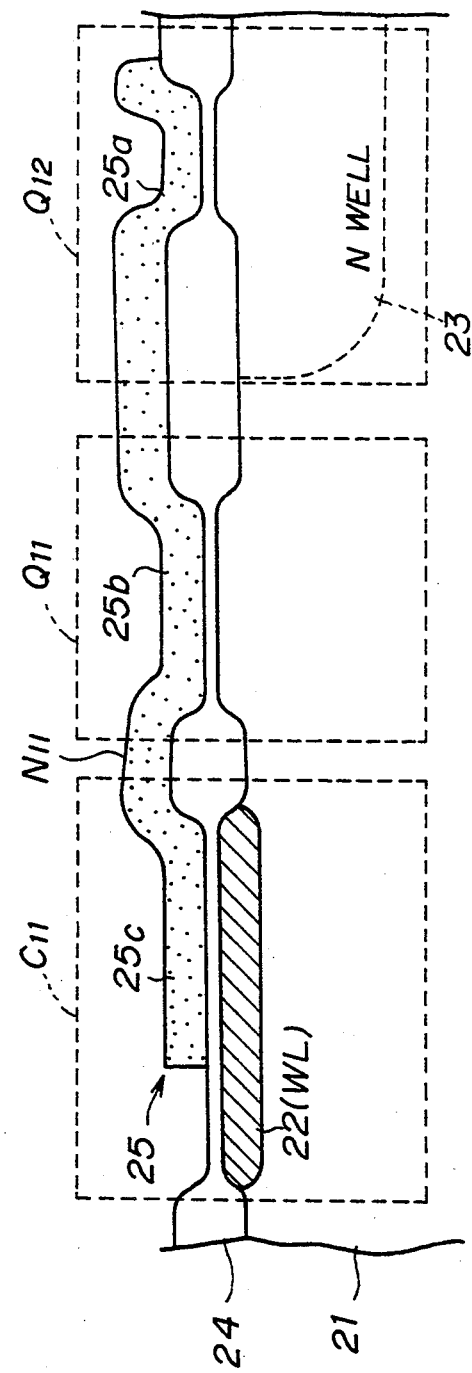

MEMORY CELL HAVING FLOATING GATE AND SEMICONDUCTOR MEMORY USING THE SAME

The application is a continuation of application Ser. No. 07/623,343, filed Dec. 6, 1990, now abandoned.

BACKGROUND OF THE INVENTION

The present invention generally relates to a memory cell having a floating gate, such as the gate of a metal oxide semiconductor field effect transistor. Further, the present invention is concerned with a semiconductor memory using a plurality of such memory cells, such as an electrically erasable programmable read only memory.

Various types of semiconductor memories are known. Erasable read only memories (ROMs) are widely used. It is possible to erase data from the erasable read only memory and then write data therein. As is known, erasable read only memories are classified into erasable programmable read only memories (EPROMs) and electrically erasable programmable read only memories (EEPROMs), in view of the respective data erasing methods. Currently, it is required to reduce the electrical power consumed in EPROMs and EEPROMs.

Referring to FIG. 1, there is illustrated a conventional semiconductor memory having a floating gate. The semiconductor memory shown in FIG. 1 is composed of a data input terminal 1, a write amplifier (WA) 2, a sense amplifier (SA) 3, a capacitor C01, an N-type field effect transistor Q01 such as a MIS (metal insulator semiconductor) or MOS (metal oxide semiconductor) transistor, and a data output terminal 5. The sense amplifier 3 is made up of an amplifier 4 and a resistor R01. A high-potential side power source (line) Vcc is coupled to an input terminal of the amplifier 4, and an output terminal thereof is connected to the data output terminal 5. A connection node at which the input terminal of the amplifier 4 is connected to the resistor R01 is connected to the drain of the transistor Q01 via a sense line SL. Similarly, an output terminal of the write amplifier 2 is connected to the drain of the transistor Q01 via the sense line SL. A word line WL is coupled to the gate of the transistor Q01 via the capacitor C01. The capacitor C01 and the transistor Q01 form a memory cell of the EPROM. Data is stored, in the form of a charge, in a floating node N01 at which the capacitor C01 is connected to the gate of the transistor Q01. The source of the transistor Q01 is grounded.

Generally, the memory cell shown in FIG. 1 has two polysilicon layers formed at different layer levels. Recently, there has been proposed a single polysilicon layer structure, as shown in FIG. 2. A semiconductor substrate 6 has an impurity diffused layer (region) 7 having a conduction type opposite to that of the semiconductor substrate 6. An oxide film 8 is formed on a surface of the semiconductor substrate 6, and a polysilicon layer 9 is formed on the oxide film 8. Drain and source regions of the transistor Q01 are formed in portions of the semiconductor substrate 6 which are arranged in a direction perpendicular to the drawing sheet and located on both sides of a portion 9a of the polysilicon layer 9. The MOS type field effect transistor Q01 shown in FIG.1 is made up of the source and drain regions and the portion 9a of the polysilicon layer 9, and the capacitor C01 is made up of the impurity diffused region 7 and the remaining portion of the polysilicon layer 9. The impurity diffused layer 7 functions as a control gate and the word line WL. The polysilicon film 9 is electrically insulated from the other parts by the oxide film 8, and functions as a floating gate or node N01.

When data "1" is written into the memory cell, a high-level data signal is applied to the data input terminal 1. This data signal is applied to the drain of the transistor Q01 via the write amplifier 2. On the other hand, the word line WL is set to a high level. Thereby, electrons having a large amount of energy are generated at a pinch-off point of the drain of the transistor Q01, and pass through the oxide film 8. Then, the electrons reach the polysilicon layer 9 which functions as the floating gate 9 (corresponding to the aforementioned floating node N01), and are accumulated therein. The electrons or charges accumulated in the polysilicon layer 9 cannot be discharged because the polysilicon layer 9 is electrically isolated from the other parts. Thus, a threshold voltage $V_{TH}$ of the transistor Q01 is increased. On the other hand, when data "0" is written into the memory cell, no operation is carried out, and no electrons are accumulated in the polysilicon layer 9.

The data readout operation is as follows. When data "1" is stored in the memory cell shown in FIG. 1, the transistor Q01 is OFF, and no voltage drop is developed across the resistor R01. Thus, the amplifier 4 outputs a high level to the output terminal 5. On the other hand, when data "0" is stored in the memory cell, the transistor Q01 is ON, and a current passes through the transistor Q01 via the resistor R01. Thus, a voltage drop is developed across the resistor R01, and a low level substantially equal to the ground level is applied to the amplifier 4, which outputs a low level to the output terminal 5.

When erasing data "1" in the memory cell, ultra-violet rays are projected onto the polysilicon layer 9, and energy thereof is applied to the charges stored therein. Thereby, a photo current passes from the polysilicon layer 9 to the semiconductor substrate 6 through the oxide film 8, so that the polysilicon layer 9 is discharged.

However, conventional memory cells as described above have a problem in that they consume a large amount of electrical power because it is necessary to allow a direct current to pass through the sense amplifier 3 and the sense line SL when data "0" is read out from the memory cell.

SUMMARY OF THE INVENTION

It is a general object of the present invention to provide an improved memory cell in which the above-mentioned disadvantage is eliminated.

A more specific object of the present invention is to provide a memory cell in which a reduced amount of power is consumed.

The above-mentioned objects of the present invention are achieved by a memory cell for storing data comprising: a first field effect transistor having a source receiving a first voltage, a floating gate, and a drain receiving data to be written into the memory cell and outputting the data; a second field effect transistor having a source receiving a second voltage, a floating gate connected to the floating gate of the first field effect transistor, and a drain connected to the drain of the first field effect transistor, the second field effect transistor having a conduction type opposite to that of the first field effect transistor; and a capacitor having a first terminal receiving a select signal for identifying the memory cell, and a second terminal connected to the floating gates of the first and second field effect transistors. The data is stored in the floating gates of the first and second field effect transistors.

The above-mentioned objects of the present invention are also achieved by a memory cell for storing data comprising: a first field effect transistor having a source receiving a first voltage, a floating gate, and a drain outputting data stored in the memory cell; a second field effect transistor having a source receiving a second voltage, a floating gate connected to the floating gate of the first field effect transistor, and a drain connected to the drain of the first field effect transistor, the second field effect transistor having a conduction type opposite to that of the first field effect transistor; a third field effect transistor having a drain receiving data to be written into the memory cell, a source receiving the second voltage, and a gate connected to the gates of the first and second field effect transistors; and a capacitor having a first terminal receiving a select signal for identifying the memory cell, and a second terminal connected to the floating gates of the first and second field effect transistors and the gate of the third field effect transistor.

The data is stored in the floating gates of the first and second field effect transistors.

Another object of the present invention is to provide a semiconductor memory using the above-mentioned memory cell.

This object of the present invention is achieved by a semiconductor memory comprising a data input terminal, a memory cell, write amplifier means for writing data applied to the data input terminal into the memory cell, and a data output terminal. The memory cell is configured as described previously.

BRIEF DESCRIPTION OF THE DRAWINGS

Other objects, features and advantages of the present invention will become more apparent from the following detailed description when read in conjunction with the accompanying drawings, in which:

FIG. 3 is a circuit diagram of a semiconductor memory according to a first preferred embodiment of the present invention;

FIGS. 4A, 4B and 4C are respectively cross-sectional views of a memory cell shown in FIG. 3;

DESCRIPTION OF THE PREFERRED EMBODIMENTS

Figure 1:
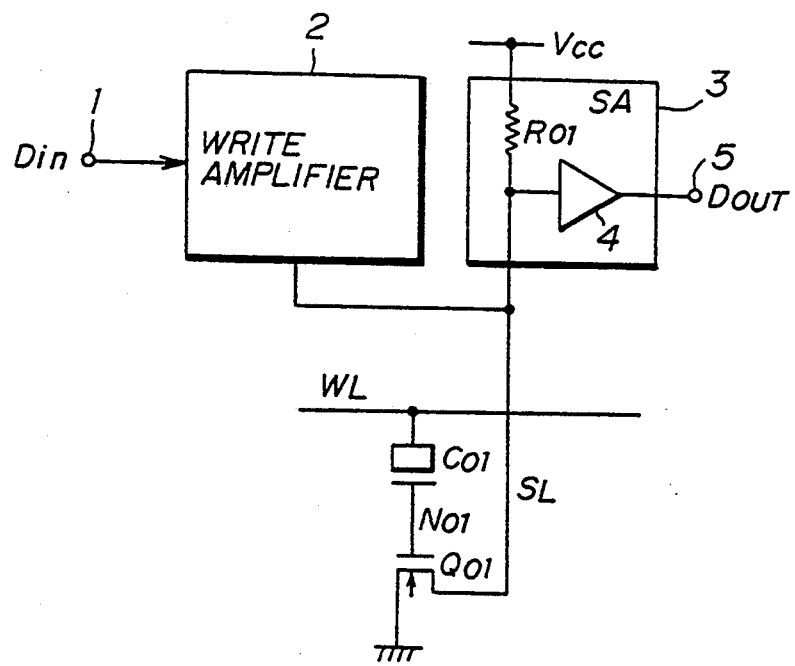
FIG. 1 is a circuit diagram of a conventional semiconductor memory.
Figure 2:
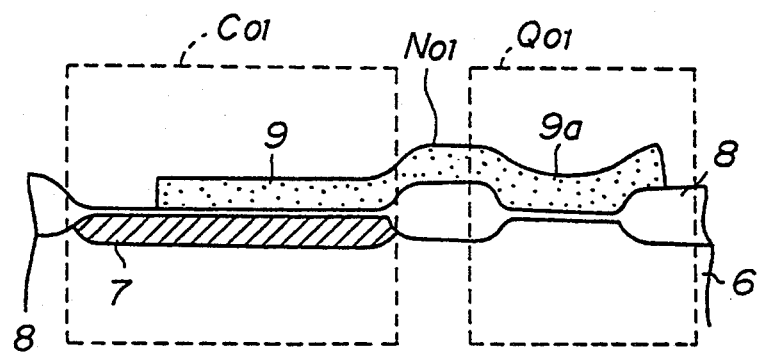
FIG. 2 is a cross-sectional view of a memory cell shown in FIG. 1.

A description will now be given of a semiconductor memory according to a first preferred embodiment of the present invention. Referring to FIG. 3, the semiconductor memory shown in FIG. 3 has a data input terminal 11, a write amplifier (WA) 12, a sense amplifier (SA) 13, a voltage generator 14, a data output terminal 16 and a memory cell 17. The write amplifier 12 has an input terminal connected to the data input terminal 11, and an output terminal connected to an input terminal of the sense amplifier 13 and the memory cell 17. The sense amplifier 13 has an amplifier 15, which has an input terminal serving as the input terminal of the sense amplifier 13, and an output terminal connected to the data output terminal 16.

The memory cell 17 is composed of an N-channel field effect transistor Q11, a P-channel field effect transistor Q12 and a capacitor C11. The source of the transistor Q12 is connected to an output terminal of the voltage generator 14. The voltage generator 14 generates a voltage $V_{SE}$, which is applied, as a power source voltage, to the source of the transistor Q12. The drain of the transistor Q12 is connected to the drain of the transistor Q11, the output terminal of the write amplifier 12, and the input terminal of the sense amplifier 13 via the sense line SL. The source of the transistor Q11 is grounded and thus set to a low-potential side power source voltage Vss. The gates of the transistors Q11 and Q12 are connected to each other and also to the word line WL via the capacitor C11. Data is stored in a floating gate (node) N11 formed at a connection where capacitor C11 and the gates of the transistors Q11 and Q12 are mutually connected. When a voltage higher than the sum total of a threshold voltage $V_{THN}$ of the transistor Q11 and a threshold voltage $V_{THP}$ of the transistor Q12 is applied to the source of the transistor Q12, a direct current will pass through the transistors Q11 and Q12. For this reason, the voltage generator 14 generates, from the power source voltage Vcc, the voltage $V_{SE}$ which is lower than the sum total of the threshold voltage $V_{THN}$ of the transistor Q11 and the threshold voltage $V_{THP}$ of the transistor Q12.

Figure 4C:
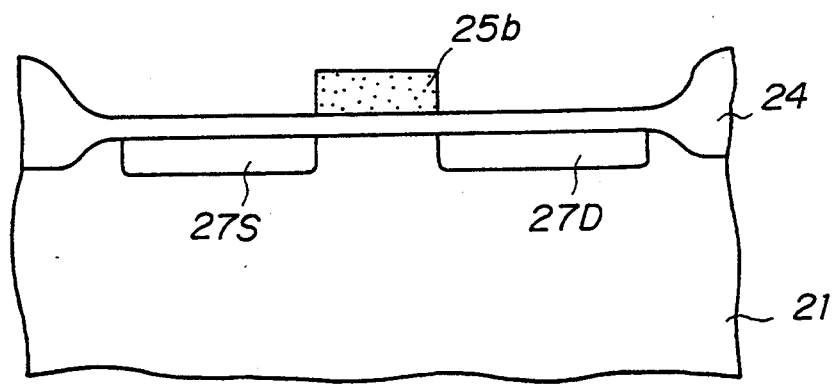
Figure 4B:
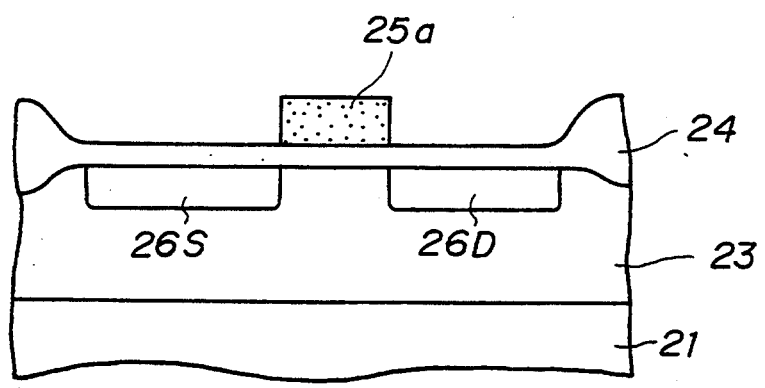

Referring to FIG. 4A, there is illustrated the layer structure of the memory cell 17 shown in FIG. 3. An N+-type impurity diffused region 22 is formed in a P-type semiconductor substrate 21. An N-type impurity diffused region (well) 23 is also formed in the semiconductor substrate 21. Further, as shown in FIG. 4B, two P+-type impurity diffused regions 26S and 26D serving as the source and drain of the transistor Q12 are formed in predetermined portions of the N-type well 23 and located on both respective, opposite sides of the polysilicon layer 25. It will be noted that FIG. 4B is a diagram taken along a line extending in the direction perpendicular to the drawing sheet of FIG. 4A. An oxide film 24 is formed on the surface of the semiconductor substrate 21, and a polysilicon layer 25 is formed on the oxide film 24. A portion of the polysilicon layer 25 forms the aforementioned floating gate N11. A portion 25a of the polysilicon layer 25 above the N-type well 23 functions as the gate of the P-channel MOS transistor Q12. A portion 25c of the polysilicon layer 25 above the N+-type impurity diffused region 22 together with the, oxide film 24, forms the capacitor C11. An intermediate portion 25b of the polysilicon layer 25 functions as the gate of the N-type MOS transistor Q11. As shown in FIG. 4C, two N+-type impurity diffused regions 27S and 27D serving respectively as the source and drain of the transistor Q11 are formed in the semiconductor substrate 21 and located on respective, opposite sides of the intermediate portion 25b.

A description will now be given of the operation of the semiconductor memory shown in FIG. 3. The word line WL is set to a high level equal to, for example, 12 V, when data "1" is written into the memory cell 17. At the same time, a high-level input signal Din coupled to the data input terminal 11 is output to the sense line SL via the write amplifier 12, and applied to the drain of the transistor Q11. The word line WL corresponds to the N+-type impurity diffused region 22, which also functions as the control gate. Thus, a drain current passes through the transistor Q11, and a charge is stored in the polysilicon layer 25 which is the floating gate N11. The charge stored in the polysilicon layer 25 increases the threshold voltage of the transistor Q11.

on the other hand, when data "0" is written into the memory cell 17, a low-level input signal Din applied to the data input terminal 11 is output to the sense line SL via the write amplifier 21, and at the same time, the word line WL is set to the high level. Although the word line WL is at the high level, the drain voltage of the transistor Q11 is low. Thus, a high electrical field does not occur, and no charge is stored in the floating gate N11, that is, the polysilicon layer 25. The state where no charge is stored in the polysilicon layer 25 means that data "0" is written into the memory cell 17.

When data is read out from the memory cell 17, the word line WL is set to a level which is lower than the potential which is set when data is written. For example, the word line WL is approximately set to 5 V. When data "1" is in the memory cell 17, the charge is stored in the polysilicon layer 25, and the threshold voltage of the transistor Q11 is maintained at an increased level. Thus, the transistor Q11 is OFF, and the transistor Q12 is ON. Thus, a high-level signal is output to the output terminal 16 via the transistor Q12 and the sense amplifier 13.

On the other hand, when data "0" is in the memory cell 17, the threshold voltage of the transistor Q11 is at a level lower than that obtained when data "1" is written. Thus, the transistor Q11 is ON, and the transistor Q12 is OFF. As a result, a low level is output to the data output terminal 16 via the transistor Q11, the sense line SL and the sense amplifier 13.

As described above, even if the resistor R01 (FIG. 1) is not provided in the sense amplifier 13 and it is not designed to allow the direct current to pass through the sense line SL, it is possible to read out data from the memory cell 17. As a result, it is possible to reduce the power consumed and make the structure of the sense amplifier simple.

Figure 5A:
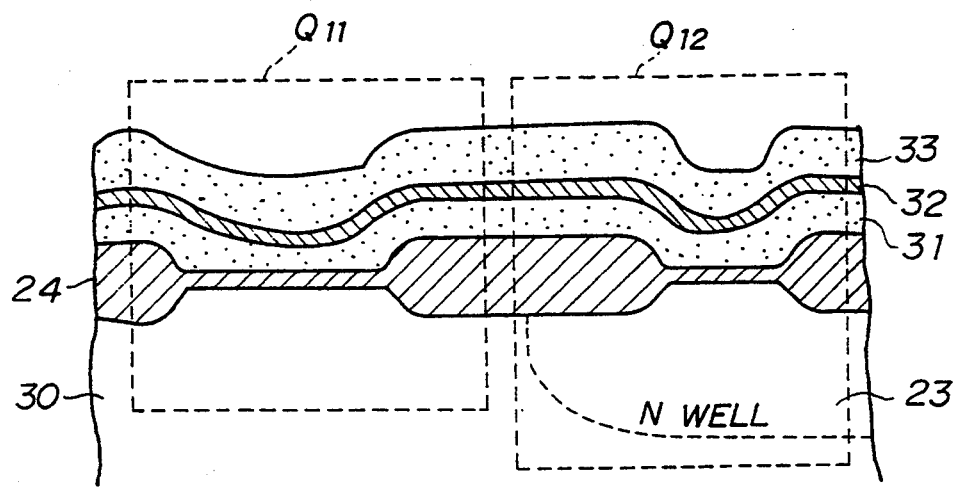
FIGS. 5A, 5B and 5C are respectively cross-sectional views illustrating an alternative layer structure of the memory cell shown in FIG. 3.
Figure 5B:
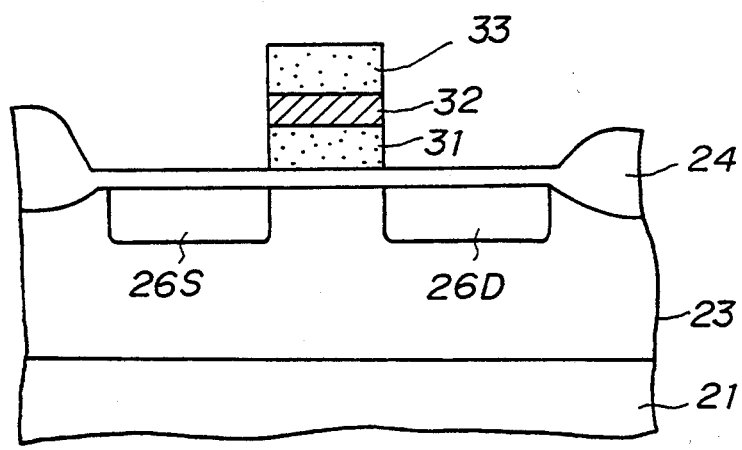
Figure 5C:
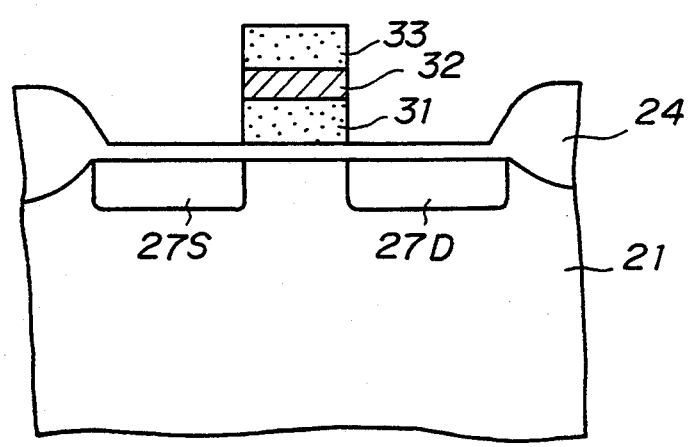

The memory cell 17 is not limited to the structure shown in FIG. 4. Alternatively, it is possible to employ a structure shown in FIGS. 5A, 5B and 5C. In these figures, those parts which are the same as those shown in FIGS. 4A, 4B and 4C are given the same reference numerals. A floating gate 31 formed of polysilicon is formed on the oxide film 24 formed on a P-type semiconductor substrate 30. An oxide film 32 is formed on the floating gate 31. A control gate 33 formed of polysilicon is formed on the oxide film 32. It will be noted that the N+-type impurity diffused region 22 (which serves as the control gate) shown in FIG. 4A is not provided in the structure shown in FIGS. 5A, 5B and 5C. The floating gate 31 corresponds to the polysilicon film 25 shown in FIGS. 4A, 4B and 4C. The control gate 33 also functions as the word line WL. The capacitor C11 is formed of the control gate 33, the oxide film 32 and the floating gate 31.

Figure 6:
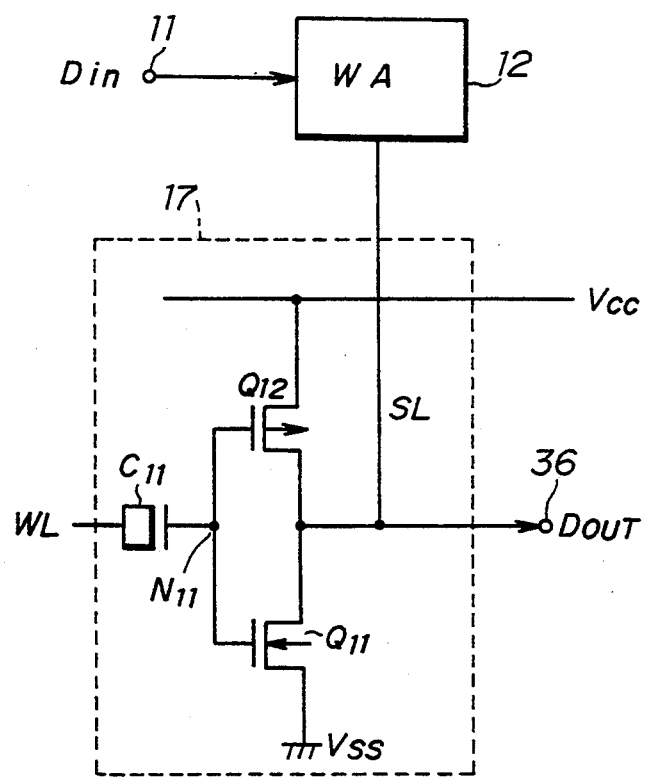
FIG. 6 is a circuit diagram of a semiconductor memory according to a second preferred embodiment of the present invention.

A description will now be given of a semiconductor memory according to a second preferred embodiment of the present invention with reference to FIG. 6, in which those parts which are the same as those shown in FIG. 3 are given the same reference numerals. The power source voltage Vcc is directly applied to the source of the P-type MOS transistor Q12. The configuration shown in FIG. 6 does not employ the voltage generator 14 shown in FIG. 3. The configuration shown in FIG. 6 is capable of generating an output voltage having an amplitude greater than that of the output voltage obtained in the aforementioned first embodiment of the present invention. The output voltage having an increased amplitude is applied to a data output terminal 36.

The threshold voltages of the transistors Q11 and Q12 shown in FIG. 6 are selected as follows. A threshold voltage $V_{TH}(N)$ of the transistor Q11 is higher than the voltage Vss (ground level) applied to the source of the transistor Q11, and a threshold voltage $V_{TH}(P)$ of the transistor Q12 is lower than the voltage Vcc applied to the source of the transistor Q12.

Figure 7:
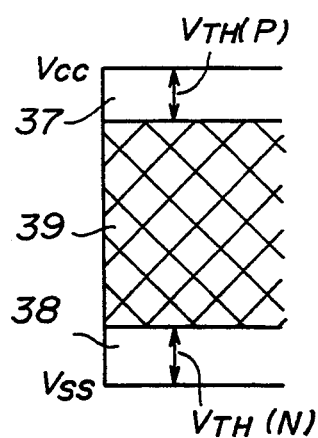
FIG. 7 is a diagram showing allowable threshold voltages of two transistors in a memory cell shown in FIG. 6.

As shown in FIG. 7, the transistors Q11 and Q12 are ON in a voltage range 39 shown by hatching, so that a direct current passes through the transistors Q11 and Q12. Thus, the threshold voltage $V_{TH}(P)$ is selected in a range 37 defined as being between the power source voltage Vcc and the highest voltage of the voltage range 39, and the threshold voltage $V_{TH}(N)$ is selected in a range 38 defined as being between the lowest voltage of the voltage range 39 and the power source voltage Vss. As compared with the first embodiment of the present invention, the configuration shown in FIG. 6 does not need the voltage generator 14, although the threshold voltages of the transistors Q11 and Q12 are limited to the ranges 38 and 37, respectively.

Figure 8:
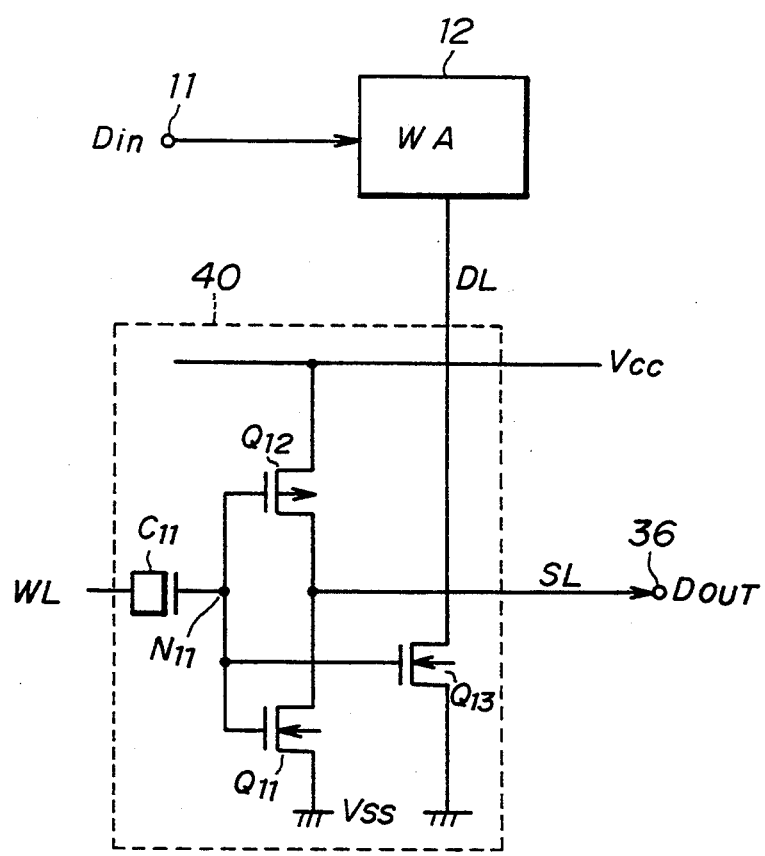
FIG. 8 is a circuit diagram of a semiconductor memory according to a third preferred embodiment of the present invention.

A description will now be given of a semiconductor memory according to a third preferred embodiment of the present invention with reference to FIG. 8, in which those parts which are the same as those shown in the previous drawings are given the same reference numerals. A memory cell 40 has an N-type field effect transistor Q13 such as a MOS transistor in addition to the transistors Q11 and Q12. The gate of the transistor Q13 is connected to the gates of the transistors Q11 and Q12. The drain of the transistor Q13 is connected to a data line DL extending from the output terminal of the write amplifier 12, and the source thereof is grounded. The transistor Q13 is exclusively used when data is written into the memory cell 40.

In the aforementioned first and second embodiments of the present invention, the high voltage is applied to the drain of the transistor Q11. Thus, it is necessary to form the impurity diffused layer 27D functioning as the drain of the transistor Q11 so that it has a thickness (depth) which ensures a high breakdown voltage. Correspondingly, it is necessary to form the impurity diffused layer 26D functioning as the drain of the transistor Q12 so that it has a high breakdown voltage. With the above in mind, in the third embodiment of the present invention, the transistor Q13 specifically used when data is written into the memory cell 40 has been provided. By employing the transistor Q13, it is not required to use transistors having a breakdown voltage which is as great as that required for the first and second embodiment of the present invention. For example, it is sufficient for the transistors Q12 and Q11 to have threshold voltages approximately equal to 5 V and 12-13 V, respectively.

When data is written into the memory cell 40, the high voltage is applied to the drain of the transistor Q13 via the data line DL, and at the same time, the word line WL is set to the high level. Thereby, hot electrons are introduced in the floating gate N11 which is the gate of the transistor Q13, and accumulated therein. When data is read out from the memory cell 40, the transistor Q13 is not used at all. It is also possible to add the transistor Q13 to the configuration shown in FIG. 3.

Figure 9:
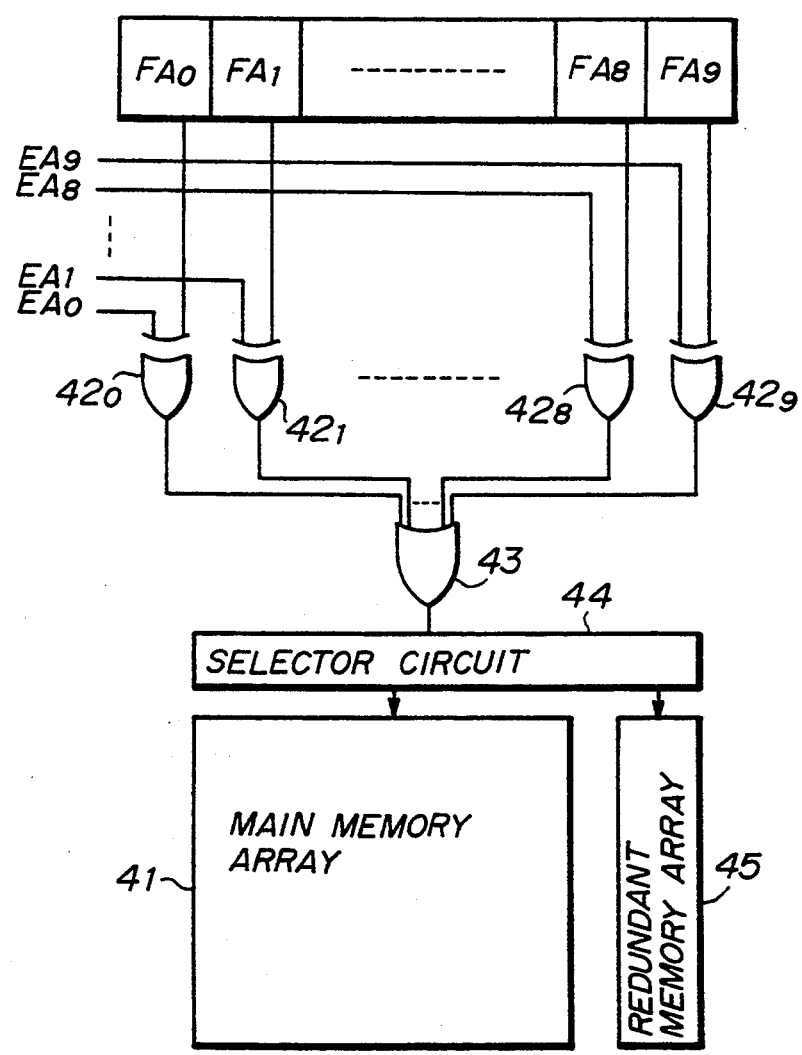
FIG. 9 is a block diagram illustrating an application of the present invention.

A description will now be given of an application of the present invention. FIG. 9 is a block diagram of a semiconductor integrated memory device. The device in FIG. 9 has defective cell address storage cells FA0 through FA9 formed of memory cells according to the present invention. The defective cell address storage cells FA0-FA9 respectively store one-bit data of a defective cell address which indicates a defective memory cell array in a main memory array 41.

The defective cell address read out from the storage cells FA0-FA9 is applied to a group of exclusive-OR gates $42_0$-$42_9$. For example, the one-bit data read out from the storage cell FA0 is applied to the exclusive-OR gate $42_0$. An external address consisting of 10 bits, $EA_0$-$EA_9$ is applied to the group of the exclusive-OR gates $42_0$-$42_9$. For example, the address bit $EA_0$ of the external address is applied to the exclusive-OR gate $42_0$. Each of the exclusive-OR gates $42_0$-$42_9$ determines whether or not the two input bits coincide with each other. Each of the exclusive-OR gates $42_0$-$42_9$ outputs a high-level signal when the input signals do not coincide with each other, and outputs a low-level signal when they coincide with each other. The output signals of the exclusive-OR gates $42_0$-$42_9$ are applied to a ten-input OR gate 43. When the external address coincides with the defective cell address read out from the storage cells FA0-FA9, the OR gate 43 generates a low-level output signal, which is input to a selector circuit 44.

In response to the low-level output signal from the OR gate 43, the selector circuit 44 selects a redundant memory array 45 in place of the main memory array 41. Thereby, the use of the defective memory cell in the main memory array 41 is inhibited. On the other hand, when a high-level output signal is applied to the selector circuit 44 from the OR gate 43, the selector circuit 44 selects the main memory array 41.

Conventionally, the defective cell storage cells FA0-FA9 are formed of fuses which can be electrically melted or melted by a laser beam. When the storage cells FA0-FA9 are formed of fuses which are electrically melted, it is necessary to use transistors having a high breakdown voltage. This leads to an increase in the chip area. On the other hand, when the storage cells FA0-FA9 are formed of fuses which are melted by the laser beam, it is necessary to provide a laser beam device which emits the laser beam.

These problems are eliminated by forming the storage cells FA0-FA9 of the memory cells according to the present invention. In this case, it is possible to write data in the storage cells FA0-FA9 without using a large amount of current. Further, no direct current passes through the memory cells of the storage cells FA0-FA0 when reading out data, so that an increase in the standby current of the memory device is prevented. Furthermore, the storage cells FA0-FA9 do not need a large chip area.

Figure 10:
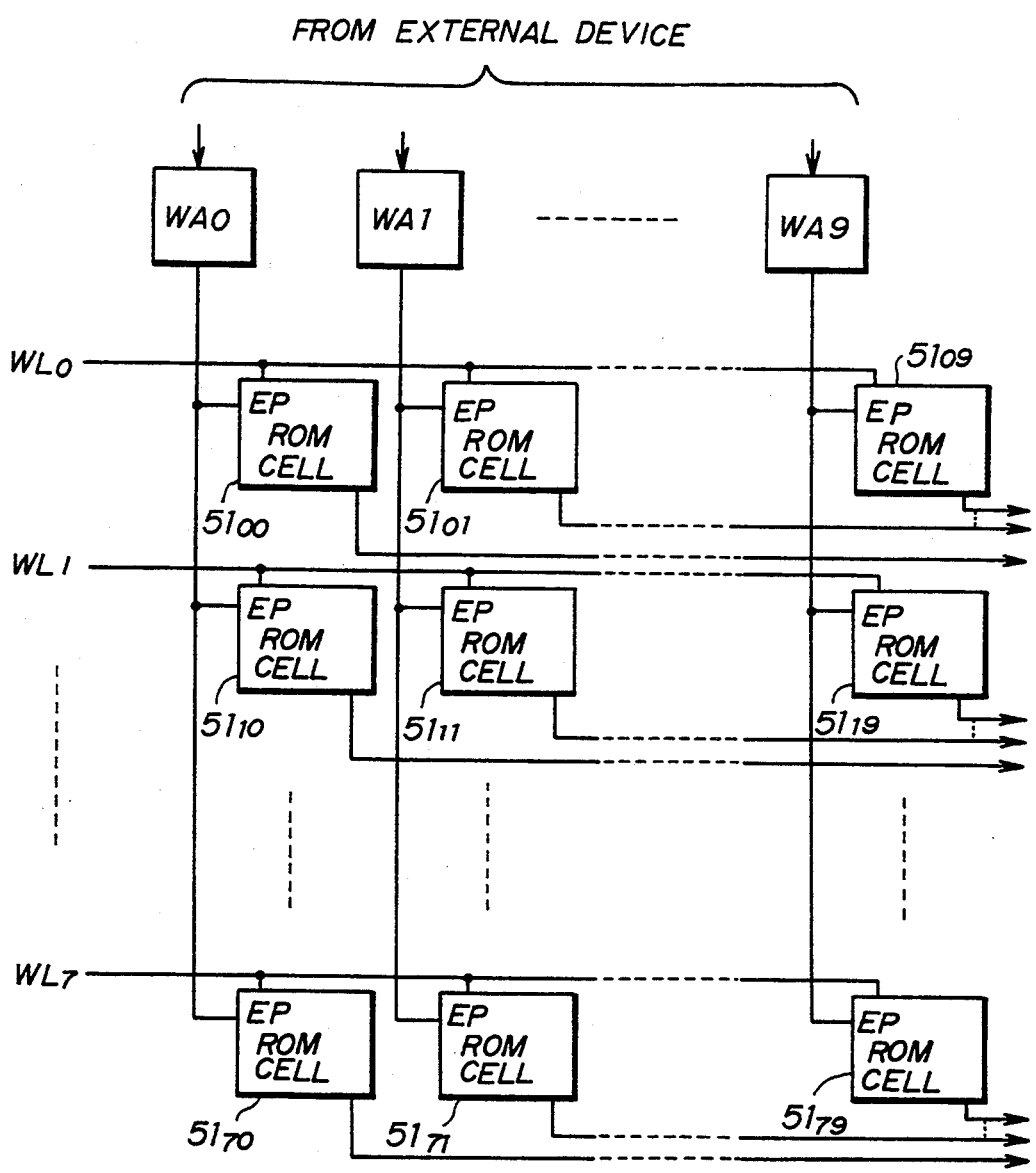
FIG. 10 is a block diagram illustrating another application of the present invention.

A further description will now be given of another application of the present invention. In actuality, defective cell storage cells are arranged in an array. Referring to FIG. 10, EPROM cells $51_{00}$-$51_{79}$ according to the present invention are arranged in eight rows and ten columns. One write amplifier (WAN) is provided in common for 71 memory cells aligned in a column. For example, a write amplifier WA0 is provided in common for the EPROM cells $51_{00}$-$51_{70}$. Similarly, write amplifiers WA1 through WA9 are provided. Eight word lines WL0-WL7 are provided for the respective rows of the array. For example, the word line WL0 is provided in common for the EPROM cells $51_{00}$-$51_{09}$.

The word line WL0 is set to a high level, and 10 bits of the defective cell address generated by an external device (not shown for the sake of simplicity) are respectively input to the write amplifiers WA0-WA9. Thereby, the 10 bits of the defective cell address are written into the respective EPROM cells $51_{00}$-$51_{09}$. Next, the word line WL1 is set to the high level, and 10 bits of the next defective cell address are respectively input to the write amplifiers WA0-WA9. Then, the 10 bits of the above next defective cell address are written into the respective EPROM cells $51_{10}$-$51_{19}$. In this way, eight defective cell addresses are written into the EPROM cells $51_{00}$-$51_{79}$.

Figure 11:
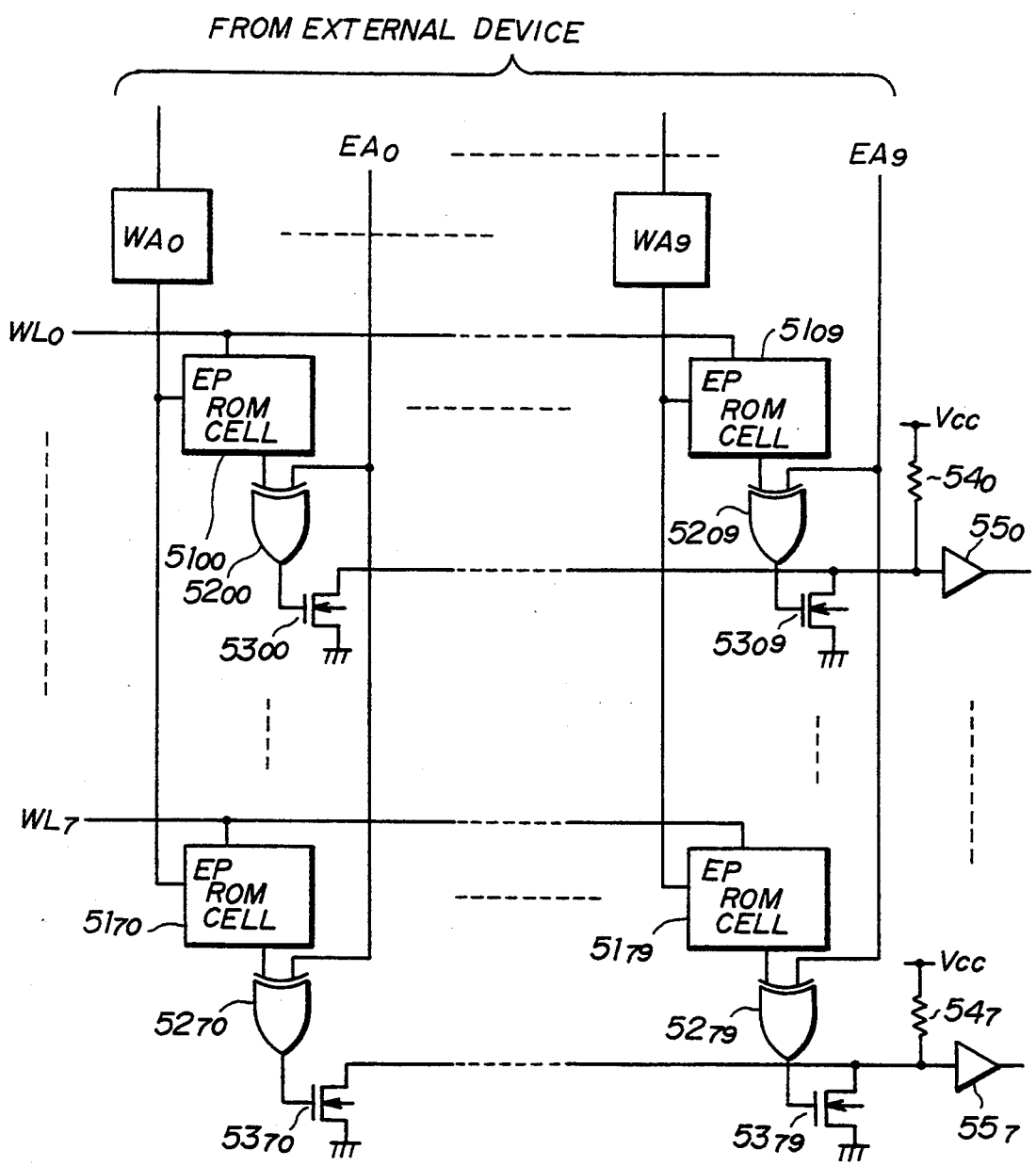
FIG. 11 is a block diagram illustrating still another application of the present invention.
Figure 12A:
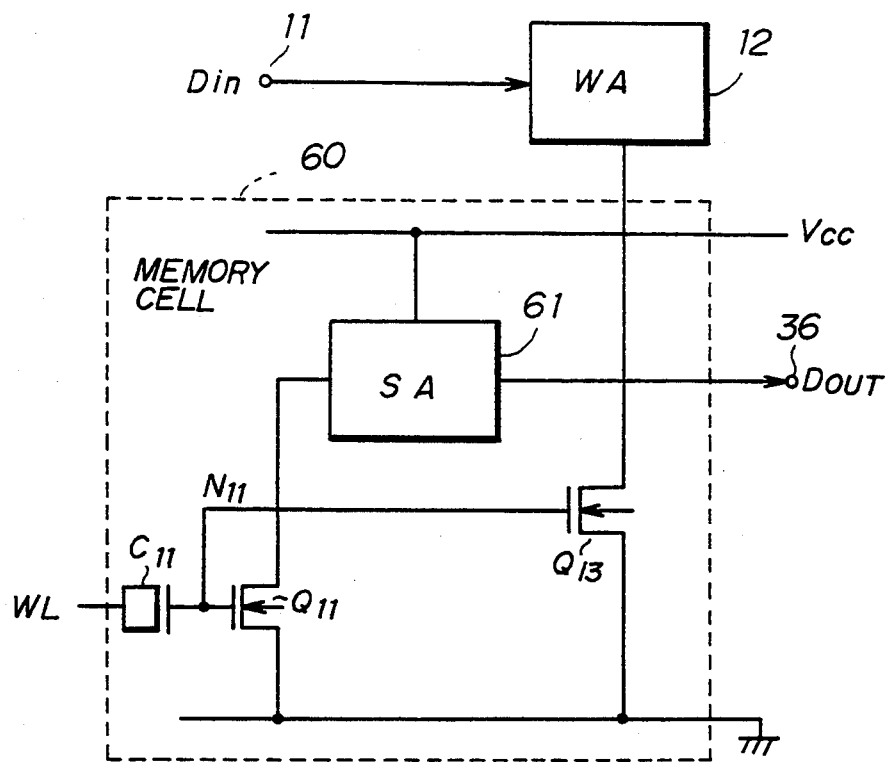
FIG. 12A is a circuit diagram illustrating a modification of the memory cell shown in FIG. 8.
Figure 12B:
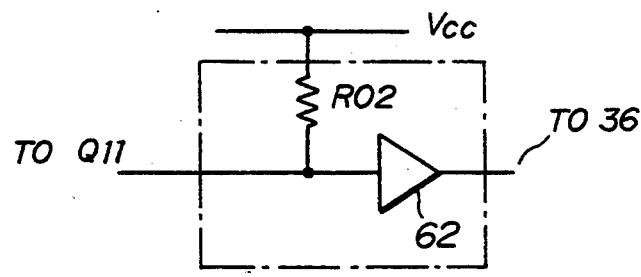
FIG. 12B is a circuit diagram illustrating a sense amplifier shown in FIG. 12A.

FIG. 11 shows another defective cell address storage cell array. In FIG. 11, those parts which are the same as those shown in FIG. 10 are given the same reference numerals. Exclusive-OR gates $52_{00}$-$52_{79}$ are respectively provided for the EPROM cells $51_{00}$-$51_{79}$, and compare the one-bit data of the defective cell address with the corresponding one-bit data of the external address generated by an external device (not shown for the sake of simplicity). For example, the exclusive-OR gate $52_{00}$ compares the one-bit data output from the EPROM cell $51_{00}$ with the one-bit data $EA0$ of the external address. N-type field effect transistors $53_{00}$-$53_{79}$ are provided for the exclusive-OR gates $52_{00}$-$52_{79}$, respectively, and have the gates which receive the output signals from the exclusive-OR gates $52_{00}$-$52_{79}$. For example, the output signal of the exclusive-OR gate $52_{00}$ is applied to the gate of the transistor $53_{00}$. Pull-up resistors $54_0$-$54_7$ are respectively provided for the rows of the transistors $53_{00}$-$53_{79}$. The drains of the transistors $53_{00}$-$53_{79}$ are pulled up to the power source voltage Vcc via the pull-up resistors $54_0$-$54_7$. Amplifiers $55_0$-$55_7$ are respectively provided for the rows of the transistors $53_{00}$-$53_{79}$. Input terminals of the amplifiers $55_0$-$55_7$ are connected to the corresponding pull-up resistors $54_0$-$54_7$ and the drains of the corresponding transistors $53_{00}$-$53_{79}$.

The array of the EPROM cells $51_{00}$-$51_{79}$ stores eight defective addresses in total. Each of the defective cell addresses is stored in the corresponding EPROM cell arranged in the row. The EPROM cells $51_{00}$-$51_{79}$ are used only when data are read out from the main memory array 41 (shown in FIG. 9). The defective cell address read out from the EPROM cells ($51_{j0}$–$51_{j9}$ where j=0–7) arranged in the row being considered is compared with the external address consisting of EA0–EA9 by the corresponding exclusive-OR gates $52_{j0}$–$52_{j9}$. More specifically, during the time when the external address consisting of EA0–EA9 is input, the word line WL0 is increased to the high level, and the one-bit data are read out from the EPROM cells $51_{00}$–$51_{09}$, which are compared with the address bits EA0–EA9 by the exclusive-OR gates $52_{00}$–$52_{09}$. When the above bits coincide with each other, the corresponding exclusive-OR gate outputs the low-level signal, which turns OFF the corresponding transistor. On the other hand, when the above bits do not coincide with each other, the corresponding exclusive-OR gate outputs the high-level signal, which turns ON the corresponding transistor. For example, when one of the exclusive-OR gates $52_{j0}$–$52_{j9}$ detects the fact that the input bits do not coincide with each other, the corresponding exclusive-OR gate generates the high-level signal, which turns ON the corresponding transistor. Thus, the drains of all the transistors $53_{j0}$–$53_{j9}$ are grounded. Thus, the amplifier 55j generates the low-level signal. On the other hand, when all the exclusive-OR gates $52_{j0}$–$52_{j9}$ detect the fact that the input bits coincide with each other, they output the low-level signals, and all the transistors $53_{j0}$–$53_{j9}$ are OFF. Thus, the amplifier 55j generates the high-level signal, which is output to the selector circuit 44 shown in FIG. 9. Then, the selector circuit 44 selects a corresponding redundant memory cell in the redundant memory array 45.

In the above-mentioned way, the word lines WL0–WL7 are successively selected, and the comparison operation on the corresponding address bits is carried out. It should be appreciated that the configuration shown in FIG. 11 uses only eight output lines which carry the signals indicating whether or not the related input address bits coincide with each other. That is, the comparison results of the 10 exclusive-OR gates are grouped for every 10 bits, and one signal indicating whether or not the related input address bits coincide with each other. It will be noted that the configuration shown in FIG. 10 uses 80 output lines.

It is possible to form each of the EPROM cell: $51_{00}$–$51_{79}$ shown in FIGS. 10 and 11 in a memory cell 60 shown in FIG. 13A. The memory cell 60 has a sense amplifier 61 which is substituted for the aforementioned transistor Q12 shown in FIG. 8. The sense amplifier 61 may have a configuration which is the same as that of the sense amplifier 3 shown in FIG. 1. That is, as shown in FIG. 13B, the sense amplifier 61 has a resistor R02 connected between the power source line Vcc and the drain of the transistor Q11 and the amplifier 61 having an input terminal connected to the drain of the transistor Q11, and an output terminal connected to the data output terminal 36. When a charge is in the floating gate N11, the transistor Q11 is OFF, and thus, the high-level signal is output to the data output terminal 36. On the other hand, when no charge is stored in the floating gate N11, the low-level signal is output to the data output terminal 36.

The present invention includes not only EPROMs but also EEPROMs. The present invention is not limited to the specifically disclosed embodiments, and variations and modifications may be made without departing from the scope of the present invention.

What is claimed is:

1. A memory cell for storing data comprising:
a first field effect transistor having a source receiving a first voltage, a floating gate, and a drain receiving data to be written into said memory cell and outputting said data, said first field effect transistor having a first threshold voltage;
a second field effect transistor having a source receiving a second voltage, a floating gate connected to the floating gate of said first field effect transistor, and a drain connected to the drain of said first field effect transistor, said second field effect transistor having a conduction type opposite to that of said first field effect transistor and having a second threshold voltage;
said first field effect transistor and said second field effect transistor having an operating voltage range in which both the first field effect transistor and said second field effect transistor are ON;
said first threshold voltage being higher than the highest voltage of said operating voltage range and lower than said first voltage;
said second threshold voltage being lower than the lowest voltage of said operating voltage range and higher than said second voltage; and
a capacitor having a first terminal receiving a select signal for identifying said memory cell, and a second terminal connected in common to the respective floating gates of said first and second field effect transistor, said data being stored in the floating gates of said first and second field effect transistors.

2. A memory cell for storing data comprising:
a first field effect transistor having a source receiving a first voltage, a floating gate, and a drain receiving data to be written into said memory cell and outputting said data;
a second field effect transistor having a source receiving a second voltage, a floating gate connected to the floating gate of said first field effect transistor, and a drain connected to the drain of said first field effect transistor, said second field effect transistor having a conduction type opposite to that of said first field effect transistor;
a capacitor having a first terminal receiving a select signal for identifying said memory cell, and a second terminal connected in common to the respective floating gates of said first and second field effect transistors, said data being stored in the floating gates of said first and second field effect transistors;
said first and second field effect transistors and said capacitor having, in common, a semiconductor substrate, an insulator film formed on said semiconductor substrate and a conduction layer;
said first field effect transistors having a well region, formed in said semiconductor substrate and having a conduction type opposite to that of said semiconductor substrate, and source and drain regions being formed in said well region;
said second field effect transistor having source and drain regions formed in said semiconductor substrate;
said capacitor having an impurity diffused region formed in said semiconductor substrate and having a conduction type which is the same as that of said well region; and
said conduction layer comprising a first portion located above said well region of said first field effect transistor and functioning as the floating gate of said first field effect transistor, a second portion located between the source and drain regions of said second field effect transistor and functioning as the floating gate of said second field effect transistor; and a third portion located above said impurity diffused region of said capacitor and serving as the first terminal of said capacitor.

3. A memory cell for storing data comprising:
a first field effect transistor having a source receiving a first voltage, a floating gate, and a drain receiving data to be written into said memory cell and outputting said data;
a second field effect transistor having a source receiving a second voltage, a floating gate connected to the floating gate of said first field effect transistor, and a drain connected to the drain of said first field effect transistor, said second field effect transistor having a conduction type opposite to that of said first field effect transistor;
a capacitor having a first terminal receiving a select signal for identifying said memory cell, and a second terminal connected in common to the respective floating gates of said first and second field effect transistors, said data being stored in the floating gates of said first and second field effect transistors;
said first and second field effect transistors and said capacitor having, in common, a semiconductor substrate, a first insulator film formed on said semiconductor substrate, a first conduction layer formed on said first insulator film, a second insulator film formed on said first conduction layer, and a second conduction layer formed on said second insulator film;
said first field effect transistor having a well region, formed in said semiconductor substrate and having a conduction type opposite to that of said semiconductor substrate, and source and drain regions formed in said well region;
said second field effect transistor having source and drain regions formed in said semiconductor substrate;
said first conduction layer functioning in common as the respective floating gates of said first and second field effect transistors as well as the second terminal of said capacitor; and
said second insulator film functioning as the first terminal of said capacitor.

4. A memory cell for storing data comprising:
a first field effect transistor having a source receiving a first voltage, a floating gate, and a drain outputting data stored in said memory cell;
a second field effect transistor having a source receiving a second voltage, a floating gate connected to the floating gate of said first field effect transistor, and a drain connected to the drain of said first field effect transistor, said second field effect transistor having a conduction type opposite to that of said first field effect transistor;
a third field effect transistor having a drain receiving data to be written into said memory cell, a source receiving said second voltage, and a gate connected in common to the respective gates of said first and second field effect transistors; and
a capacitor having a first terminal receiving a select signal for identifying said memory cell, and a second terminal connected in common to the respective floating gates of said first and second field effect transistors and the gate of said third field effect transistor, said data being stored in the respective floating gates of said first and second field effect transistors.

5. A memory cell as claimed in claim 4, wherein:
said first field effect transistor has a first threshold voltage;
said second field effect transistor has a second threshold voltage;
said first field effect transistor and said second field effect transistor have an operating voltage range in which both the first field effect transistor and said second field effect transistor are ON;
said first threshold voltage is higher than the highest voltage of said operating voltage range and lower than said first voltage; and
said second threshold voltage is lower than the lowest voltage of said operating voltage range and higher than said second voltage.

6. A semiconductor memory comprising:
a data input terminal;
a memory cell;
write amplifier means for writing data applied to said data input terminal into said memory cell; and
a data output terminal,
said memory cell comprising:
a first field effect transistor having a source receiving a first voltage, a floating gate, and a drain receiving the data from said write amplifier means and outputting said data to said data output terminal;
a second field effect transistor having a source receiving a second voltage, a floating gate connected to the floating gate of said first field effect transistor, and a drain connected to the drain of said first field effect transistor, said second field effect transistor having a conduction type opposite to that of said first field effect transistor; and
a capacitor having a first terminal receiving a select signal for identifying said memory cell, and a second terminal connected in common to the respective floating gates of said first and second field effect transistors,
said data being stored in the respective floating gates of said first and second field effect transistors.

7. A semiconductor memory as claimed in claim 6, further comprising voltage generating means for generating said first voltage, wherein:
said first field effect transistor has a first threshold voltage;
said second field effect transistor has a second threshold voltage; and
said first voltage is lower than the sum total of said first threshold voltage and said second threshold voltage.

8. A semiconductor memory as claimed in claim 7, further comprising sense amplifier means, coupled between said output terminal and the respective drains of said first and second field effect transistors, for receiving and amplifying said data output at the commonly connected, respective drains of said first and second field effect transistors.

9. A semiconductor memory comprising:
a data input terminal;
a memory cell;
write amplifier means for writing data applied to said data input terminal into said memory cell; and a data output terminal, said memory cell comprising:
a first field effect transistor having a source receiving a first voltage, a floating gate, and a drain receiving the data from said write amplifier means and outputting said data to said data output terminal,
said first field effect transistor having a first threshold voltage,
a second field effect transistor having a source receiving a second voltage, a floating gate connected to the floating gate of said first field effect transistor, and a drain connected to the drain of said first field effect transistor, said second field effect transistor having a conduction type opposite to that of said first field effect transistor said second field effect transistor having a second threshold voltage,
said first field effect transistor and said second field effect transistor having an operation voltage range in which both the first field effect transistor and said second field effect transistor are ON, said first threshold voltage being higher than a highest voltage of said operation voltage range and lower than said first voltage and said second threshold voltage being lower than a lowest voltage of said operation voltage range and higher than said second voltage, and
a capacitor having a first terminal receiving a select signal for identifying said memory cell, and a second terminal connected in common to the respective floating gates of said first and second field effect transistors, said data being stored in the respective floating gates of said first and second field effect transistors.

10. A semiconductor memory comprising:
a data input terminal;
a memory cell;
write amplifier means for writing data applied to said data input terminal into said memory cell; and
a data output terminal directly receiving data read out from said memory cell, said memory cell comprising:
a first field effect transistor having a source receiving a first voltage, a floating gate, and a drain directly outputting the data stored in said memory cell to said data output terminal;
a second field effect transistor having a source receiving a second voltage, a floating gate connected to the floating gate of said first field effect transistor, and a drain connected to the drain of said first field effect transistor, said second field effect transistor having a conduction type opposite to that of said first field effect transistor;
a third field effect transistor having a drain receiving the data from said write amplifier means, a source receiving said second voltage, and a gate connected to the respective gates of said first and second field effect transistors; and
a capacitor having a first terminal receiving a select signal for identifying said memory cell, and a second terminal connected in common to the respective floating gates of said first and second field effect transistors and the gate of said third field effect transistor,
said data being stored in the respective floating gates of said first and second field effect transistors.

11. A memory cell as claimed in claim 10, wherein:
said first field effect transistor has a first threshold voltage;
said second field effect transistor has a second threshold voltage;
said first field effect transistor and said second field effect transistor have an operating voltage range in which both the first field effect transistor and said second field effect transistor are ON;
said first threshold voltage is higher than the highest voltage of said operating voltage range and lower than said first voltage; and
said second threshold voltage is lower than the lowest voltage of said operating voltage range and higher than said second voltage.

* * * * *

UNITED STATES PATENT AND TRADEMARK OFFICE
CERTIFICATE OF CORRECTION

PATENT NO. : 5,404,328
DATED : April 4, 1995
INVENTOR(S) : TAKEMAE

It is certified that error appears in the above-indentified patent and that said Letters Patent is hereby corrected as shown below:

Col. 4, line 60, delete "both".

Col. 8, line 16, change "(WAN)is" to --(WAn) is--.

Col. 9, line 44, change "cell:" to --cells--.

Signed and Sealed this

Thirty-first Day of October 1995

Attest:

BRUCE LEHMAN

Attesting Officer     Commissioner of Patents and Trademarks